United States Patent
Azizi

(10) Patent No.: US 6,628,788 B2
(45) Date of Patent: Sep. 30, 2003

(54) APPARATUS AND METHOD FOR NOISE-DEPENDENT ADAPTATION OF AN ACOUSTIC USEFUL SIGNAL

(75) Inventor: Seved Ali Azizi, Eningen (DE)

(73) Assignee: Becker GmbH, Karlsbad (DE)

( * ) Notice: Subject to any disclaimer, the term of this patent is extended or adjusted under 35 U.S.C. 154(b) by 214 days.

(21) Appl. No.: 09/844,492

(22) Filed: Apr. 27, 2001

(65) Prior Publication Data

US 2001/0053229 A1 Dec. 20, 2001

(30) Foreign Application Priority Data

Apr. 27, 2000 (DE) .......................... 100 20 756

(51) Int. Cl.[7] .............................. H03G 3/20; H03G 3/00
(52) U.S. Cl. .......................................... 381/57; 381/107
(58) Field of Search ..................... 381/57, 107

(56) References Cited

U.S. PATENT DOCUMENTS 5,434,922 A   7/1995  Miller et al. ................. 381/57
5,450,494 A * 9/1995  Okubo et al. ................. 381/57
5,666,426 A   9/1997  Helms ......................... 381/57

FOREIGN PATENT DOCUMENTS

DE    197 36 699    2/1999
EP    0319777       6/1989

* cited by examiner

Primary Examiner—Forester W. Isen
Assistant Examiner—Elizabeth McChesney
(74) Attorney, Agent, or Firm—Samuels, Gauthier & Stevens, LLP

(57) ABSTRACT

The method and the apparatus specify that the acoustic useful signal is generated from a electrical useful signal, that an electrical listening signal determined by the acoustic useful signal and by an acoustic noise signal at the listening location be recorded, and from this the useful signal component contained therein be extracted. Then the useful signal component contained in the listening signal is compared with the listening signal itself, and the electrical useful signal is adapted in dependence on this.

20 Claims, 1 Drawing Sheet

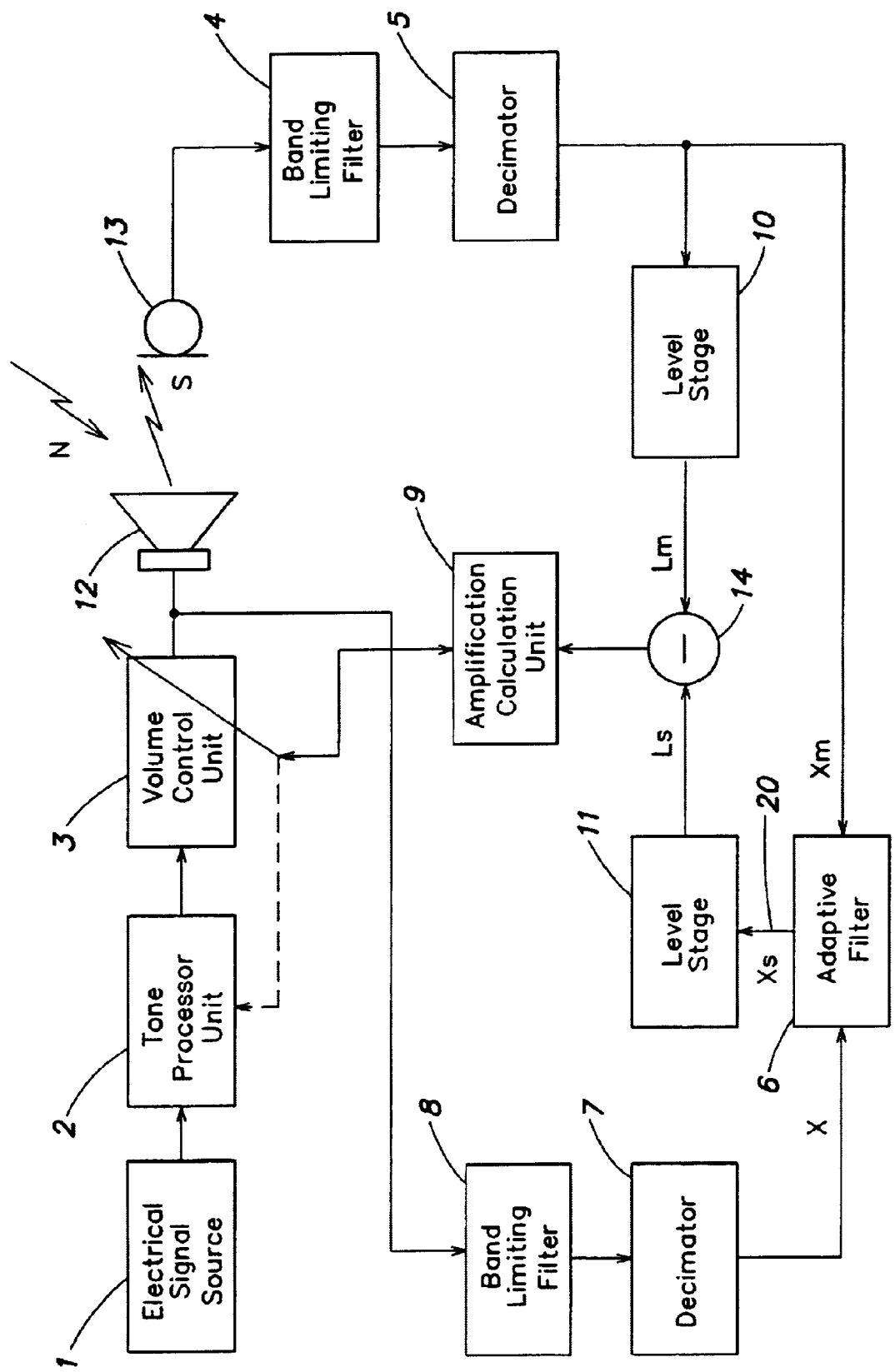

APPARATUS AND METHOD FOR NOISE-DEPENDENT ADAPTATION OF AN ACOUSTIC USEFUL SIGNAL

BACKGROUND OF THE INVENTION

The present invention relates to the field of audio processing and in particular to an apparatus and a method for the noise-dependent adaptation of an acoustic useful signal at a listening location.

When audio is played in a noisy environment, listening pleasure is often impaired by background noise. For example, the interior of a motor vehicle is a noise-filled space in which music and speech is frequently listened to. The background noise can originate from the engine, tires, ventilation, and other units in the motor vehicle. In addition, the noise may depend on the speed, the road conditions, and the operating conditions of the motor vehicle. A passenger in the motor vehicle generally responds to this constantly changing noise pattern by manually adjusting the volume of the audio being listened to.

A technique for dynamic sound optimization is disclosed in U.S. Pat. No. 5,434,922 entitled "Method and Apparatus for Dynamic Sound Optimization". This patent discloses that the volume of the acoustic useful signal is automatically adjusted as a function of the background noise. A microphone captures the total sound in the listening room, and the total signal (i.e., including the desired signal and noise) is processed to extract the noise component from the total signal. This extracted noise component is compared with the original signal of a tone source in a subsequent amplification-calculation stage. The result of this comparison is then used to automatically adjust the volume of the acoustic useful signal output to the listener.

A problem with this technique is that the noise component cannot be completely extracted. As a result, components of the acoustic useful signal are contained in the extracted noise component. Therefore, the overall apparatus uses a noise level that is higher than the actual noise level as a basis to automatically adjust the volume. This causes the volume to be increased. This process is often referred to as "gain chase" which ends with the maximum possible volume level being set, causing the listener in the motor vehicle manually intervene in order to reduce the volume. To prevent "gain chase" U.S. Pat. No. 5,434,922 discloses considerable additional complexity.

Therefore, there is a need for a technique of automatically adjusting the volume in order to compensate for noise within the listening environment.

SUMMARY OF THE INVENTION

Briefly, according to the present invention, an apparatus includes a tone source that generates an electrical useful signal, which is adjustable by a control signal. An acoustic transducer receives the electrical useful signal and generates an acoustic signal indicative thereof. An acoustic receiver generates an electrical listening signal from the acoustic useful signal as well as from an acoustic noise signal at the listening location. An extractor extracts the useful signal component contained in the listening signal. A control device whose input is coupled to the acoustic receiver and to the extractor, and whose output is coupled to the tone source, controls the tone source as a function of the result of comparing the useful signal component contained in the listening signal with the listening signal itself. If, for example, a certain noise signal component is also contained in the extracted useful signal component, the result is the volume of the acoustic useful signal is reduced, which consequently leads to a lesser noise signal component in the extracted useful signal. However, this decrease of the acoustic useful signal level compared to the noise signal level causes the influence of the noise signal level on the volume to increase, and consequently increases the accuracy of the entire apparatus. Finally, the entire apparatus will swing into a stable value.

The present invention is also directed to an invention method that creates the acoustic useful signal from a electrical useful signal, and records an electrical listening signal determined by the acoustic useful signal and by an acoustic noise signal at the listening location. The listening signal is processed to extract the useful signal component contained in the listening signal. The useful signal component contained in the listening signal is compared with the listening signal itself, to generate a control signal that is used to adapt the electrical useful signal as a function of the result of the comparison step.

The extraction preferably is performed by adaptive filtering such that the useful signal component contained in the audible signal is extracted from the electrical audible signal by using the electrical useful signal taken from the tone source. Adaptive filters have the advantage of achieving high precision with relatively little complication. The adaptive filtering process preferably proceeds utilizing the least means square (LMS) method.

To control the volume, the ratio of the useful signal component contained in the audible signal to the audible signal itself is evaluated. To form this ratio the logarithms are taken of the levels of the useful signal component contained in the audible signal and of the audible signal itself, and these level logarithms are subtracted from one another. This corresponds to the formation of a ratio with subsequent formation of the logarithm, which can be more useful, for example, for adjusting the volume. Forming the two levels with subsequent subtraction has the advantage of being implemented easily, especially in digital circuit technology. As the level, one can use, for example, the level of the average absolute values or preferably the power level.

The entire apparatus is preferably designed at least partially in digital circuit technology. Similarly, the inventive method is implemented, for example, by an appropriately programmed digital signal processing device (e.g., a signal processor). The electric useful signal and electric listening signal are digital signals and/or digitized signals with a certain sampling rate. The extraction and/or the comparison is then performed at a reduced sampling rate. This measure can substantially reduce the entire calculation complication.

The present invention is delineated against previous solutions especially by requiring extremely little additional complication. Furthermore, the invention assures in principle that the volume will not automatically increase under any circumstances.

These and other objects, features and advantages of the present invention will become more apparent in light of the following detailed description of preferred embodiments thereof, as illustrated in the accompanying drawings.

BRIEF DESCRIPTION OF THE DRAWING

The FIGURE is a block diagram illustration of an audio processing system.

DETAILED DESCRIPTION OF THE INVENTION

The embodiment shown in the FIGURE includes a tone source having an electrical signal source 1, a tone processor unit 2, a volume control unit 3, and an active loudspeaker unit 12. In a motor vehicle application, the electrical signal source 1 is preferably a compact disk player, a radio receiver, a compact cassette player, an MP3 player, or another sound medium player. In a preferred embodiment, the signals delivered by the signal source 1 are in digital form. Possibly needed analog-to-digital converters are not shown in the drawing for the sake of simplicity.

The tone processor unit 2 includes, for example, a tone control device, a compression device, a noise suppression system, and the like. The volume control unit 3 is constructed and arranged in such a way that the volume can be adjusted by two control signals independently of one another. One control signal is created by an external control element which, for example, can be designed as a conventional volume control that is manually adjusted by the motor vehicle passengers. The other control signal is used to automatically adapt the volume level to the ambient noise detected within the vehicle according to the present invention. The volume is thus automatically adjusted to obtain a useful signal-to-noise ratio (SNR). The active loudspeaker unit 12 includes appropriate sound transducers as well as the stages necessary to drive the sound transducers and, in case of digital actuation, a digital-to-analog converter.

The loudness and possibly other variables such as, for example, compression and frequency response, are controlled by a device whose front interface includes a microphone 13 that senses the sound present in the interior of the motor vehicle. The sensed sound includes the acoustic useful signal S radiated by the active loudspeaker unit 12 and, the acoustic noise signal N appearing as background noise. The microphone signal is amplified and, for example, is converted into a corresponding digital signal by an analog-to-digital converter (not shown). This digital signal serves as the electrical listening signal Xm. The listening signal Xm is conducted to an adaptive filter 6, which employs for example the LMS technique. The tone source signal X at the output of the volume control unit 3 is also applied to the adaptive filter 6. The adaptive filter 6 adjusts itself in such a fashion that the acoustically useful signal component Xs contained in the listening signal Xm is provided as an output from the adaptive filter. To keep the adaptive filter 6 and other components as simple as possible, sampling rate reduction devices are connected into the signal paths of the listening signal Xm and of the tone source signal X. In a relatively simple case, these devices include band limiting filters 4, 8 as well as decimator 5, 7, respectively.

The adaptive filter 6 may be designed either as a recursive structure (IIR) or a nonrecursive structure (FIR) with a suitable length and step width. The adaptive filter 6 uses the tone source signal X and the listening signal Xm to extract approximately the noise-free acoustically useful signal Xs. The adaptive filter 6 provides an output signal on a line 20 indicative of the extracted useful signal Xs. The adaptive filter 6 is configured and arranged to simulate the signal path between the active loudspeaker unit 12 and the microphone 13.

The listening signal Xm and the extracted useful signal Xs are compared, preferably by forming the ratio of the two signals. In one embodiment, the ratio is determined by first forming the respective power levels of the two signals Xs and Xm, namely Ls and Lm respectively, and then subtracting the two levels Ls and Lm from one another. The levels can also be determined, for example, by a simple filter with a suitable time constant, that receive the squared sampling values of the extracted useful signal Xs and of the listening signal Xm. The extracted useful signal Xs and the listening signal Xm are conducted to a level stage 11 and 10 respectively, whose outputs subtract the two levels from one another via a subtractor 14. Instead of using power levels, the average squared amplitude (power) or the average absolute values etc. can also be compared to one another in similar fashion.

An amplification-calculation unit 9 following the subtractor 14 calculates the amplification gradation, on the basis of the result of the subtraction at the output of the subtractor 14. This ensures that the difference of the powers Lm-Ls, which corresponds to the useful signal power/noise power ratio (in dB), remains below a minimum level after a certain given reaction time has elapsed. The amplification is gradually increased, as long as the difference remains greater than a certain prescribed value.

Although the present invention has been shown and described with respect to several preferred embodiments thereof, various changes, omissions and additions to the form and detail thereof, may be made therein, without departing from the spirit and scope of the invention.

What is claimed is:

1. An apparatus for the noise-dependent adaptation of a acoustic useful signal (S) in a listening location, said apparatus comprising:
    a source that generates an electrical useful signal (X), which is adjustable in response to a control signal;
    a loudspeaker that receives said electrical useful signal and provides an audio signal indicative thereof;
    an acoustic receiver that senses audio within the listening location and provides an electrical listening signal (Xm) indicative thereof, wherein said electrical listening signal (Xm) includes components associated with said acoustic useful signal (S) and an acoustic noise signal (N);
    signal processing means responsive to said electrical listening signal (Xm), for processing said electrical listening signal (Xm) to extract a useful signal component (Xs) and provide a signal indicative thereof;
    a comparator that receives and compares signals indicative of said electrical listening signal (Xm) and said useful signal component (Xs), and provides a difference signal indicative thereof; and
    an amplification control device that receives said difference signal and provides said control signal to control said tone source.

2. The apparatus of claim 1, wherein said signal processing means includes an adaptive filter that receives a signal indicative of said electrical useful signal and a signal indicative of said electrical listening signal (Xm), and provides said useful signal component (Xs).

3. The apparatus of claim 2, wherein said adaptive filter includes means for least mean square processing.

4. The apparatus of claim 2, wherein said comparator includes means for forming the ratio of said useful signal component (Xs) and said listening signal (Xm).

5. The apparatus of claim 4, wherein said means for forming includes means for forming the level of said useful signal (Xs) contained in said listening signal (Xm) and the level of said listening signal (Xm) itself, and computing the difference between the computed levels of said useful signal (Xs) and said listening signal (Xm).

6. The apparatus of claim 5, further comprising means responsive to said electrical listening signal (Xm) for filtering and decimating said electrical listening signal and for providing a decimated electrical listening signal indicative thereof to said signal processing means.

7. The apparatus of claim 1, wherein said audio processing device is configured and arranged to operate in motor vehicle.

8. A method for noise-dependent adaptation of an acoustic useful signal (S), in a listening location, comprising:
   creating the acoustic useful signal (S) from a electrical useful signal (X);
   sensing in the listening location an audio signal that contains said acoustic useful signal (S) and an acoustic noise signal (N), and providing an electrical listening signal (Xm) indicative thereof;
   processing said electrical listening signal (Xm) to extract the useful signal component (Xs) contained in said electrical listening signal (Xm);
   comparing the useful signal component (Xs) contained in the listening signal with the listening signal (Xm); and
   adapting the electrical useful signal (X) as a function of the result of the comparison step.

9. The method of claim 7, wherein said step of processing includes adaptive filtering to extract the useful signal component (Xs) contained in the listening signal (Xm) from the electrical listening signal (Xm), by using the electrical useful signal (X).

10. The method of claim 9, wherein said step of adaptive filtering includes LMS processing.

11. The method of claim 8, wherein said step of comparing comprises the step of forming a ratio of the useful signal component (Xs) contained in the listening signal to the listening signal (Xm) itself.

12. The method of claim 11, in which, to form this ratio, the level (Ls) of the useful signal component (Xs) contained in the listening signal, and the level (Lm) of the listening signal (Xm) are formed, and the two levels (Ls, Lm) are subtracted from one another.

13. The method of claim 8, in which the electrical useful signal (X) and the electrical listening signal (Xm) are digital signals and/or digitized signals with a particular sampling rate and the extraction step and/or the comparison step are performed at a comparatively reduced sampling rate.

14. The method of claim 8, wherein the listening location is within a motor vehicle.

15. An audio processing device, comprising:
   an audio transducer that senses an audio signal that includes a desired audio signal component and a noise signal component, and provides a sensed audio signal indicative thereof;
   first means for filtering and decimating said sensed audio signal and for providing a decimated sensed audio signal indicative thereof;
   second means for filtering and decimating a drive signal indicative of said desired audio signal and for providing a decimated drive signal indicative thereof;
   an adaptive filter that receives said decimated sensed audio signal and said decimated drive signal, and processes said decimated sensed audio signal to extract a signal indicative of said decimated drive signal and provide an extracted signal indicative thereof;
   a comparator that receives and compares signals indicative of said extracted signal and said decimated drive signal, and provides a difference signal indicative thereof; and
   an amplification control device that receives said difference signal and provides a volume control signal as a function of said difference signal.

16. The audio precessing device of claim 15, wherein said first means comprises a bandpass filter and a decimator.

17. The audio processing device of claim 15, wherein said first means comprises a serially configured digital filter and a decimator.

18. The audio processing device of claim 15, wherein said adaptive filter comprises means for performing least mean square computations.

19. The audio processing device of claim 15, comprising:
   an audio electrical signal source and a tone processor unit in cascade that provide an audio signal to a volume control unit that provides said drive signal to a loudspeaker, wherein said volume control unit is responsive to said volume control signal.

20. The audio processing device of claim 15, wherein said audio processing device is configured and arranged to operate in motor vehicle.

* * * * *